United States Patent
Hurwitz et al.

(10) Patent No.: US 8,987,602 B2
(45) Date of Patent: Mar. 24, 2015

(54) MULTILAYER ELECTRONIC SUPPORT STRUCTURE WITH COFABRICATED METAL CORE

(75) Inventors: Dror Hurwitz, Zhuhai (CN); Alex Huang, Hsin Chu (TW)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 202 days.

(21) Appl. No.: 13/523,102

(22) Filed: Jun. 14, 2012

(65) Prior Publication Data

US 2013/0333924 A1    Dec. 19, 2013

(51) Int. Cl.
*H05K 1/11*    (2006.01)
*H05K 1/09*    (2006.01)
*H05K 3/46*    (2006.01)
*H05K 1/02*    (2006.01)

(52) U.S. Cl.
USPC ........... 174/251; 174/266; 174/257; 174/258; 156/151

(58) Field of Classification Search
CPC ............ H05K 1/11; H05K 1/09; H05K 3/46; H05K 1/02
USPC ................... 174/251, 266, 257, 258; 156/151
See application file for complete search history.

(56) References Cited

U.S. PATENT DOCUMENTS

| | | | | |
|---|---|---|---|---|
| 3,918,926 | A * | 11/1975 | Wolski et al. ................. | 428/601 |
| 7,230,187 | B2 * | 6/2007 | Xu et al. ........................ | 174/255 |
| 7,635,641 | B2 | 12/2009 | Hurwitz et al. | |
| 7,669,320 | B2 | 3/2010 | Hurwitz et al. | |
| 7,682,972 | B2 | 3/2010 | Hurwitz et al. | |
| 8,198,543 | B2 * | 6/2012 | Kang et al. .................... | 174/254 |
| 8,705,248 | B2 * | 4/2014 | Ito et al. ........................ | 361/765 |
| 8,729,222 | B2 * | 5/2014 | Li et al. ......................... | 528/377 |

* cited by examiner

*Primary Examiner* — Timothy Thompson
*Assistant Examiner* — Charles Pizzuto
(74) *Attorney, Agent, or Firm* — Wiggin and Dana LLP; Gregory S. Rosenblatt; Jonathan D. Hall

(57) ABSTRACT

A laminated multilayer electronic support structure comprising a dielectric with integral vias and feature layers and further comprising a planar metal core characterized by a thickness of less than 100 microns.

23 Claims, 22 Drawing Sheets

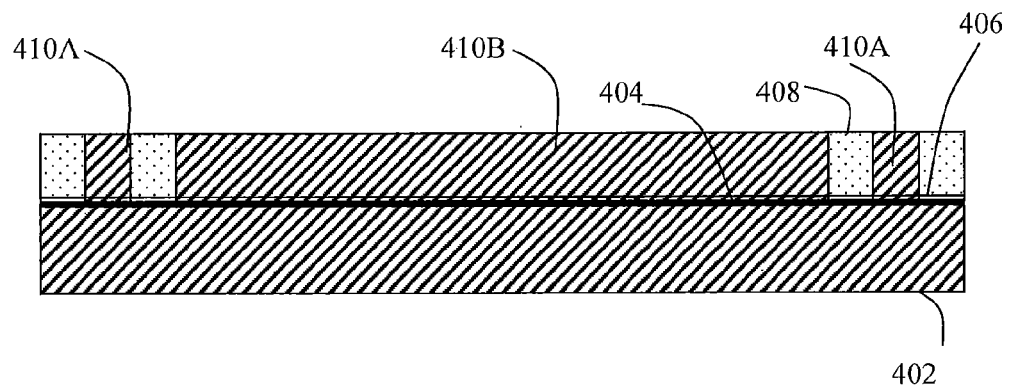
Fig. 4(iii)

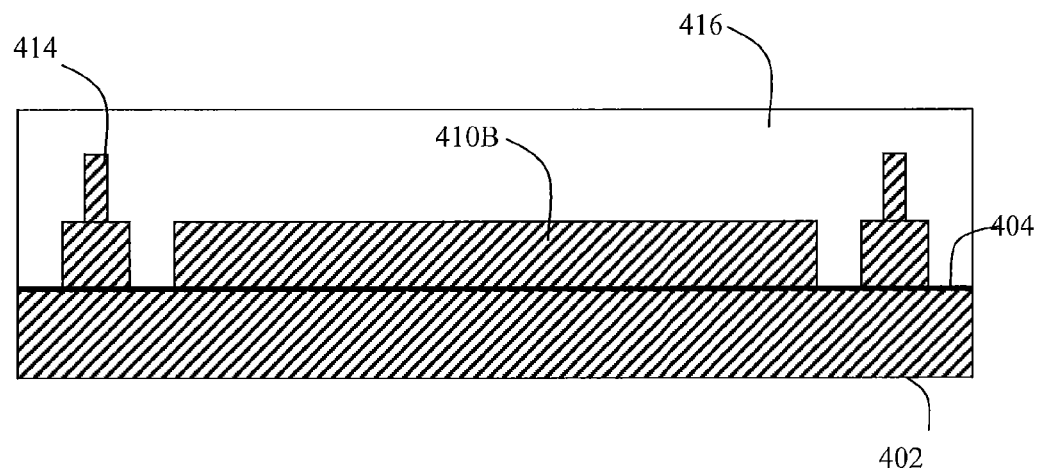
Fig. 4(vii)

Fig. 4(viii)

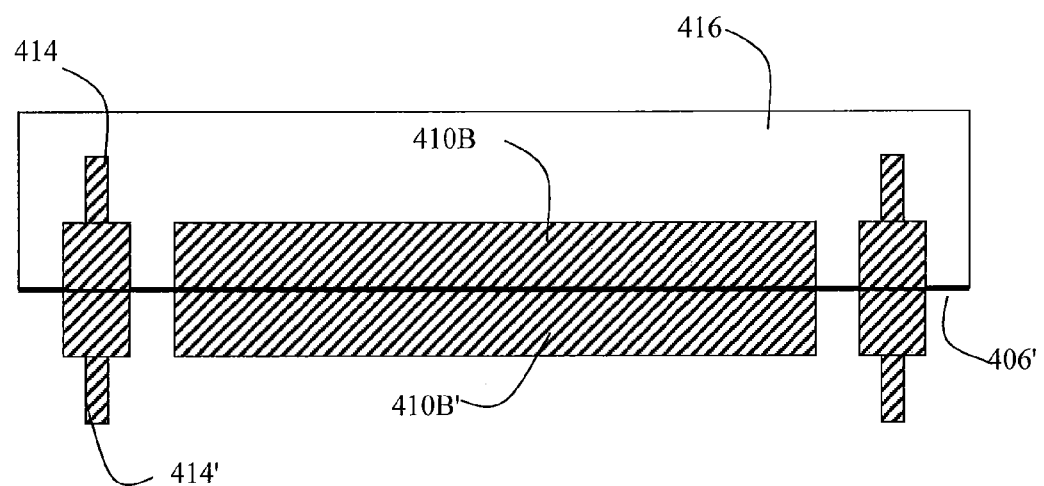
Fig. 4(xii)

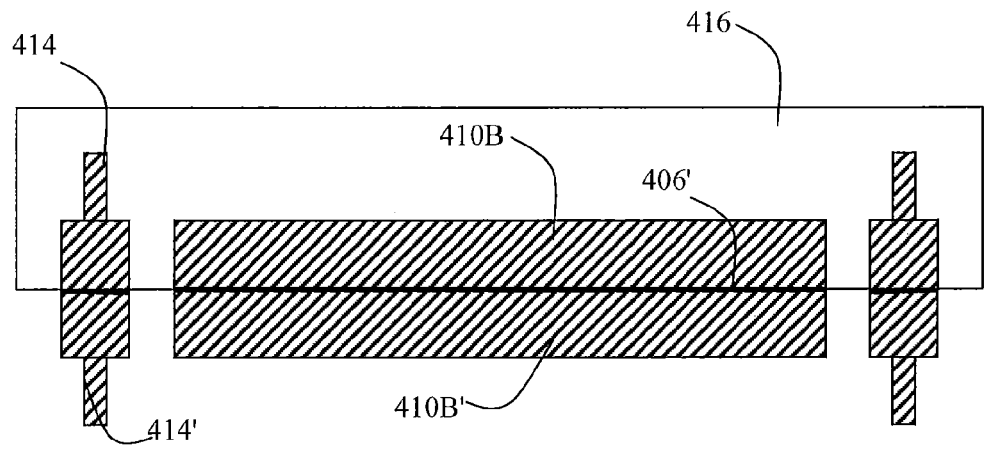
Fig. 4(xiii)
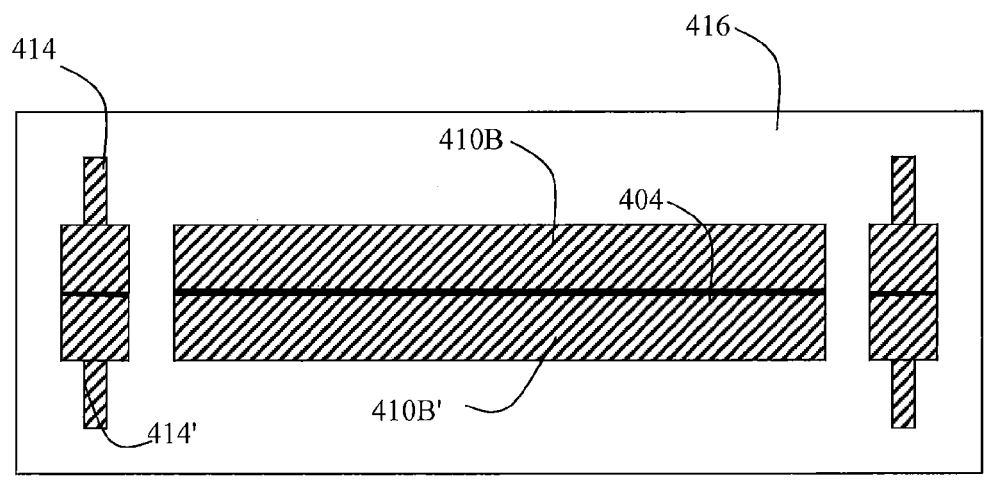
Fig. 4(xiv)

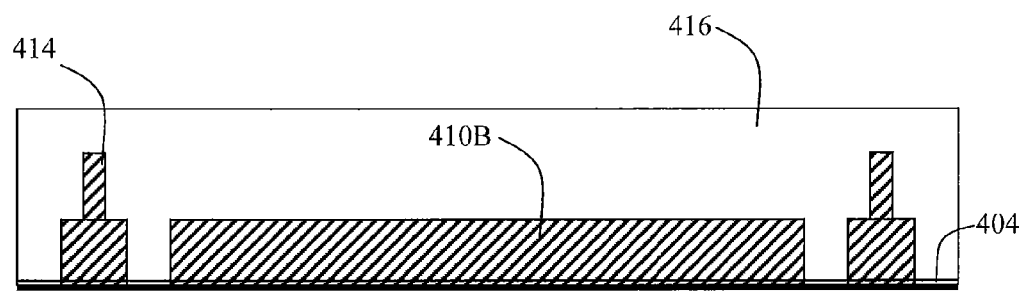
Fig. 6(iii)

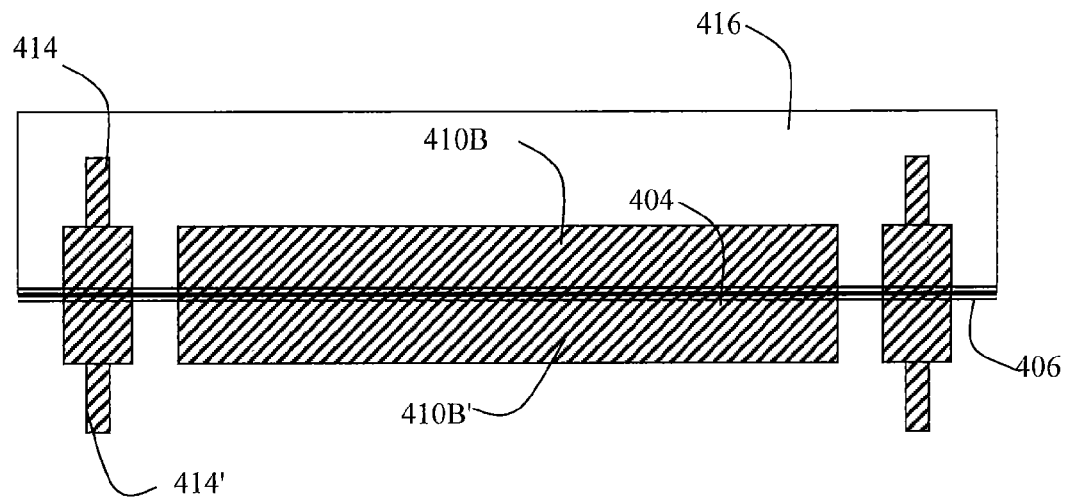
Fig. 6(vii)
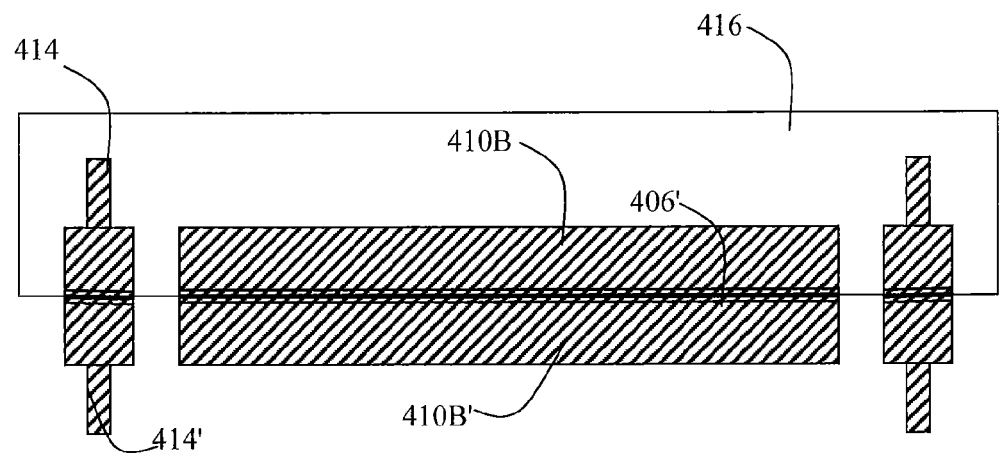
Fig. 6(viii)

MULTILAYER ELECTRONIC SUPPORT STRUCTURE WITH COFABRICATED METAL CORE

BACKGROUND

1. Field of the Disclosure

The present invention relates to multilayer electronic support structures which are generally thin yet rigid and stiff, and to methods of fabrication thereof.

2. Description of the Related Art

Advanced IC substrates in the formats of Flip Chip Ball Grid Arrays (FCBGA) and Flip Chip Scale Packages (FCCSP) usually employ a 'core' structure that is typically a Glass/Polymer dielectric composite that has a small number, typically 2 or more copper layers on one or both sides. The copper layers are electrically interconnected using Plated through holes (PTHs).

The Glass/Polymer dielectric composite core serves as a base on which a multilayer stack is built up. The multilayer stack consists of layers of dielectric, typically polymer film or prepreg, that sequentially alternate with layers of copper metal that are interconnected by filled copper micro vias.

The finished FCBGA or FCCSP substrates units are required to demonstrate a high degree of flatness and are required to be warp free in order to support subsequent process steps, such as the attaching of active (IC) and passive components in what is sometimes known as "first level assembly".

To balance stresses during processing, which could result in warpage or delamination, the multilayer stack is preferably built up on both sides of the base. After the first level assembly, the total unit, including the IC(s), passive components and the substrate that carries them, is sometimes known as an 'IC Package'.

The IC Package requires attachment to the next level of the electronic subsystem, which usually includes a Printed Circuit Board (PCB). The series of processes that are used to attach the IC Package to the PCB are sometimes referred to as 'second level assembly'.

Many modern electronic systems, particularly handheld devices such as smart phones, tablets and the like, require additional functionality, enhanced electrical performance, lower heat dissipation and ever slimmer IC packages. Consequently, the first and second level assembly processes become ever more complex since the IC substrate may carry on it 3D package architecture, such as a series of stacked dies or even another IC package using what is sometimes referred to as 'PoP', an acronym for Package on Package.

It will be appreciated from the above discussion, that advanced IC substrates in FCBGA or FCCSP formats are required to have superior flatness, not only during their own fabrication, but also in subsequent processing, since they are typically exposed to elevated temperatures and harsh processing conditions during both first and second level assembly processing.

In consequence of the above, warping of the IC substrate may severely reduce yields during first and second level assembly, especially when die stacking and 3D PoP architectures are employed. Warped FCBGA and FCCSP substrates or IC packages may cause cracks in the Flip Chip bumps interconnecting the IC to the substrate, cracks in the BGA balls that interconnect the IC package to the PCB (or to another IC package in PoP configuration) or even die cracking, all of which may lead to system failures.

The demand for ever thinner IC substrates is increasing, driven by the need to meet low form factor space requirements for modern handheld devices and to achieve lower inductance and lower thermal impedance with yet higher contact points for more device functionality. Consequently, the microelectronics industry has been considering employing what has been referred to as 'Coreless' IC substrates that have FCBGA or FCCSP type formats and are constructed out of a build up of layers, but do not include the central 'core' section. Coreless substrates of this type have significantly reduced thickness, improved system inductance due to the short via paths to and from the IC, and improved thermal impedance. However, coreless substrates are also more susceptible to warping due to their inherent lack of mechanical stiffness and the lack of support that would normally be provided by the absent core section. These problems may become acute during exposure to elevated processing temperatures when fabricating the first and second level assemblies thereupon, and particularly in consequence of the thermal processes that are employed to stack dies and/or packages.

Various coreless substrate technologies that feature build up structures with dielectric films have been proposed in recent years. Most coreless substrate technologies require an external metal frame stiffener mounted on the IC side of the substrate in order to maintain an acceptable level of flatness and to compensate for the lack of core in the structure. It will, however, be appreciated that such external stiffeners occupy premium real estate space on the top surface of the substrate, and this occupied space is unavailable for other purposes, such as for mounting passive components mounting and/or pads that may be required to couple an additional IC package stacked on the substrate surface.

One approach that addresses this problem is the use of coreless IC substrates as developed by AMITEC and as described in U.S. Pat. No. 7,682,972, U.S. Pat. No. 7,669,320 and U.S. Pat. No. 7,635,641 to Hurwitz et al. Amitec's technology allows the fabrication of a coreless substrate that may employ glass fabric/polymer composites materials (prepregs) that enhance the over all substrate flatness and warpage resistance and therefore eliminates the need for an external metal frame stiffener as described above.

Nevertheless, the ever increasing requirement demands to lower the thickness of substrates and to reduce their thermal impedances pose challenges that even the AMITEC coreless structures as described in U.S. Pat. No. 7,682,972, U.S. Pat. No. 7,669,320 and U.S. Pat. No. 7,635,641 may find hard to overcome.

BRIEF SUMMARY

Aspects of the current invention are directed at further enhancing the flatness and heat dissipation characteristics of coreless substrates. Such enhancements may be achieved by subtle improvements to the unique fabrication process flow and the resultant structure.

One aspect of the invention is directed to providing a multilayer electronic support structure comprising a dielectric with integral vias and feature layers and further comprising a planar metal core characterized by a thickness of less than 100 microns.

In some embodiments, the planar metal core is totally encapsulated.

In some embodiments, the planar metal core comprises copper.

In some embodiments, the planar metal core comprises two sections separated by a copper seed layer.

In some embodiments, the two sections are imperfectly aligned such that there is a step along at least one edge at the seed layer.

In some embodiments, the two sections are further separated by a submicron adhesion metal layer comprising at least one of the group consisting of chromium, tantalum, titanium and tungsten.

In some embodiments, the planar metal core further comprises a central barrier metal layer separating the two sections.

In some embodiments, the central barrier metal layer is selected from the group consisting of Nickel, Gold, a Nickel layer followed by a Gold layer, a gold layer followed by a Nickel layer, Tin, Lead, a Tin layer followed by a Lead layer, Tin-Lead alloy, and Tin Silver alloy and is applied by a plating method selected from the group consisting of electroplating, electroless plating and PVD.

In some embodiments, the dielectric material comprises a polymer.

In some embodiments, the polymer comprises polyimide, epoxy, Bismaleimide, Triazine and blends thereof.

In some embodiments, the dielectric material further comprises inorganic inclusions.

In some embodiments, the inorganic inclusions comprise at least one of glass fibers and particle fillers.

In some embodiments, the planar metal core is less than 80 microns thick.

In some embodiments, the integral vias and feature layers comprise copper.

In some embodiments, the structure is built substantially symmetrically around the planar metal core, having similar numbers of layers on each side of the planar metal core.

In some embodiments, the structure is built asymmetrically around the planar metal core, having dissimilar numbers of layers on each side of the planar metal core.

In some embodiments, the planar metal core is thermal conductively coupled to at least one outer surface of the multilayer electronic support structure and serves as a heat sink.

A second aspect of the invention is directed to a process for fabricating a multilayer electronic support structure with an integral planar metal core comprising the steps of:
Obtaining a sacrificial substrate;
depositing an etchant resistant electrically conducting barrier layer onto the sacrificial substrate;
fabricating a first half core and surrounding features over the barrier layer;
fabricating via posts past the first half core;
removing the electrically conducting barrier layer and surrounding features;
laminating a first dielectric layer over the first half core, surrounding features and via posts;
etching away the sacrificial substrate;
removing the electrically conducting barrier layer;
fabricating a second half core and surrounding features;
fabricating via posts past the second half core and surrounding features;
laminating a layer of dielectric over the second half core, surrounding features and via posts, and
thinning the dielectric layers on both sides to expose the ends of via posts.

In some embodiments, the process comprising the steps of:
(a) obtaining a sacrificial substrate;
(c) applying a first seed layer;
(d) applying a first layer of photoresist;
(e) exposing and developing a pattern including a first half core and surrounding features;
(g) plating a first half core and surrounding via posts into the first pattern;
(h) applying a second layer of photoresist over the first layer;
(i) exposing and developing a pattern of via posts;
(j) pattern plating a metal layer into the pattern to fabricate the via posts;
(k) stripping away the first and second layers of photoresist;
(m) laminating a first dielectric layer over the exposed first half core and surrounding via posts;
(n) etching away the sacrificial substrate;
(q) applying a third layer of photoresist;
(r) exposing and developing a pattern including a second half core and surrounding features;
(s) plating the second half core and surrounding features into the pattern;
(t) applying a fourth layer of photoresist over the second half core and surrounding features;
(u) exposing and developing a second pattern of via posts;
(v) plating a second layer of via posts into the pattern in the fourth layer of photoresist;
(w) stripping away the third and fourth layers of photoresist thereby exposing the second half core, surrounding features and via posts;
(x) etching away the seed layer;
(y) laminating a second layer of dielectric over the second half core, surrounding features and via posts, and
(z) thinning the dielectric layers to expose ends of via posts.

In some variants, the process further comprises the following steps:
(b) panel plating a barrier layer, and
(o) removing the barrier layer.

In some variants, the process further comprises the following steps:
(l) removing the first seed layer, and
(p) applying a second seed layer.

In some variants, step (x) further comprising step (x2) of etching away the barrier layer and the first seed layer.

In some variants, the process further comprises:
step (f) pattern plating a barrier layer and
step (p) depositing a second seed layer over newly exposed surface.

In some embodiments, the process further comprises building up additional layers on at least one side.

In some embodiments, the planar metal core is totally encapsulated.

The term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 4 is a detailed flowchart of one method generally shown in accordance with FIG. 3 that may be read together with FIGS. 4(*i*) to 4(*xv*);

FIG. 6 is a detailed flowchart of a variant method generally in accordance with FIG. 3, that may be read together with FIGS. 4(*i*) to 4(*iv*) and 6(*i*) to 6(*x*);

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. No. 7,682,972, U.S. Pat. No. 7,669,320 and U.S. Pat. No. 7,635,641 to Hurwitz et al., incorporated herein by reference, that there is no effective upper limit to the in-plane dimensions of a feature.

Figure 1:
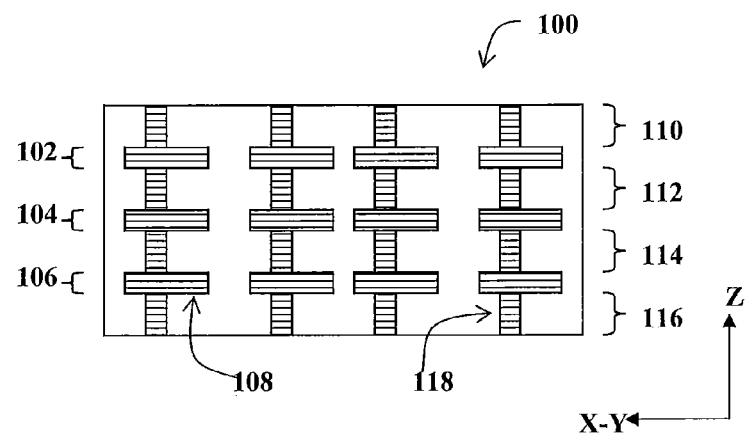
FIG. 1 is a section through a multilayer electronic support structure of the prior art.

FIG. 1 is a simplified section through a multilayer composite support structure of the prior art. Multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between the adjacent functional or feature layers. Thus the feature layers 102, 104, 106 include features 108 generally laid out within the layer, in the X-Y plane, and vias 118 that conduct current across the dielectric layers 110, 112, 114, 116. Vias 118 are designed to have minimal inductance and are sufficiently separated to have minimum capacitances therebetween.

Where vias are fabricated with drill & fill technology, the vias generally have a substantially circular cross-section. However, as described in U.S. Pat. No. 7,682,972, U.S. Pat. No. 7,669,320 and U.S. Pat. No. 7,635,641 for example, the structure of FIG. 1 may alternatively be fabricated by electroplating into a pattern in a photo-resist (pattern plating), or by panel plating and then selectively etching; either way leaving up-standing via posts, and then laminating a dielectric pre-preg thereover.

Using the 'drilled and filled via' approach, it becomes prohibitive to fabricate non-circular vias due to difficulties in cross-section control and shape. There is also a minimum via size of about 50-60 micron diameter due to the limitations of the laser drilling. These difficulties were described at length in the background section hereinabove and are related, inter-alia, to dimpling and/or domed shaping that result from the copper via fill electro-plating process, via tapering shape and side wall roughness that result from the laser drilling process and higher cost that results from using the expensive laser drilling machine for milling slots, in a 'routing' mode to generate trenches in the polymer/glass dielectrics.

It has been surprisingly found that using the flexibility of the plating and photo-resist techniques, a wide range of via shapes and sizes may be cost-effectively fabricated. Furthermore, different via shapes and sizes may be fabricated in the same layer. The proprietary via post approach developed by AMITEC, enables 'conductor via' structures that utilize the large dimensions of the via layer to conduct in the x-y plane. This is especially facilitated when the copper pattern plating approach is used, where smooth, straight, non-tapering trenches may be produced in a photo-resist material, and then filled by subsequently depositing copper into these trenches by using a metal seed layer and then filling by pattern plating copper into the trenches. In contrast to the drilled & filled via approach, via post technology enables trenches in a photoresist layer to be filled to obtain dimple-less, dome-less copper connectors. After deposition of the copper the photoresist is subsequent stripped away, the metal seed layer is subsequently removed and a permanent, polymer-glass dielectric is applied thereover and therearound. The 'via conductor' structure thus created may use the process flows as described in U.S. Pat. No. 7,682,972, U.S. Pat. No. 7,669,320 and U.S. Pat. No. 7,635,641 to Hurwitz et al.

It will be appreciated that interconnects are required to be sufficiently stiff and rigid so that chips can connect reliably to them. Warping and bending may create poor or broken connections.

One way of ensuring rigidity is to deposit the interconnect structure onto a substrate or core. Unfortunately this increases the thickness of the interconnect structure.

There is a drive for ever thinner interconnects that are also rigid and stiff.

It has surprisingly been found possible to fabricate an interconnect structure that is both thin and stiff, by electroplating an integral metal core as part of the build up. In addition to providing rigidity, such a core may help heat dissipation, particularly where coupled to the surface of the interconnect structure.

Figure 2:
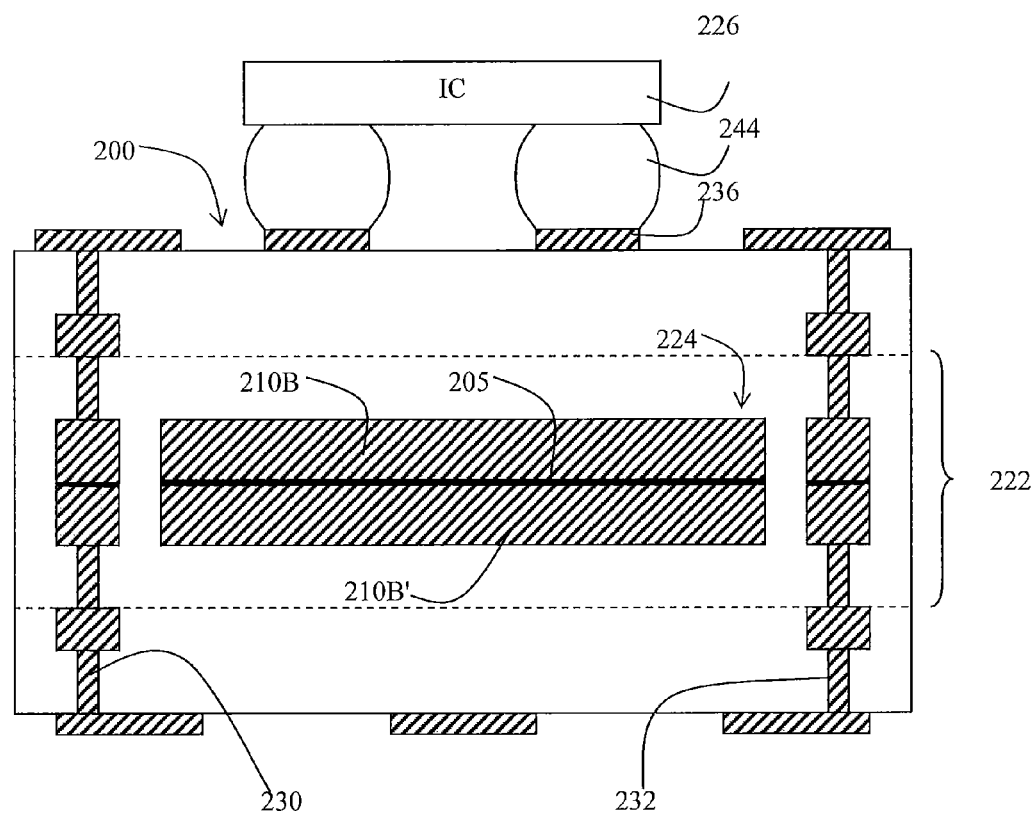
FIG. 2 is a schematic illustration of a chip support structure that may be fabricated by the methods described herein.

With reference to FIG. 2, a schematic section through a multilayer electronic interconnect support structure 200 in accordance with one embodiment of the invention is shown. Multilayer electronic interconnect support structure 200 may be characterized by including a central region 222 that includes a core 224 consisting of two electroplated layers 210B, 210B' which may include a thin layer 205 of seed layer, adhesion metal and/or barrier metal. Dimensions and materials for the thin layer 205 are discussed in more detail hereinbelow.

A chip 226 may be bonded to terminal layers 236, for example by using ball grid array 244 or by flip chip bonding. Conventional structures 230, 232 consisting of vias and feature layers may be provided on one or more sides thereof.

Although seed layers that may be sputtered or electroless plated are required to electroplate metal over dielectric, and adhesion layers may also be used, for simplicity, apart from thin layer 205, these are not shown in FIG. 2.

Figure 3:
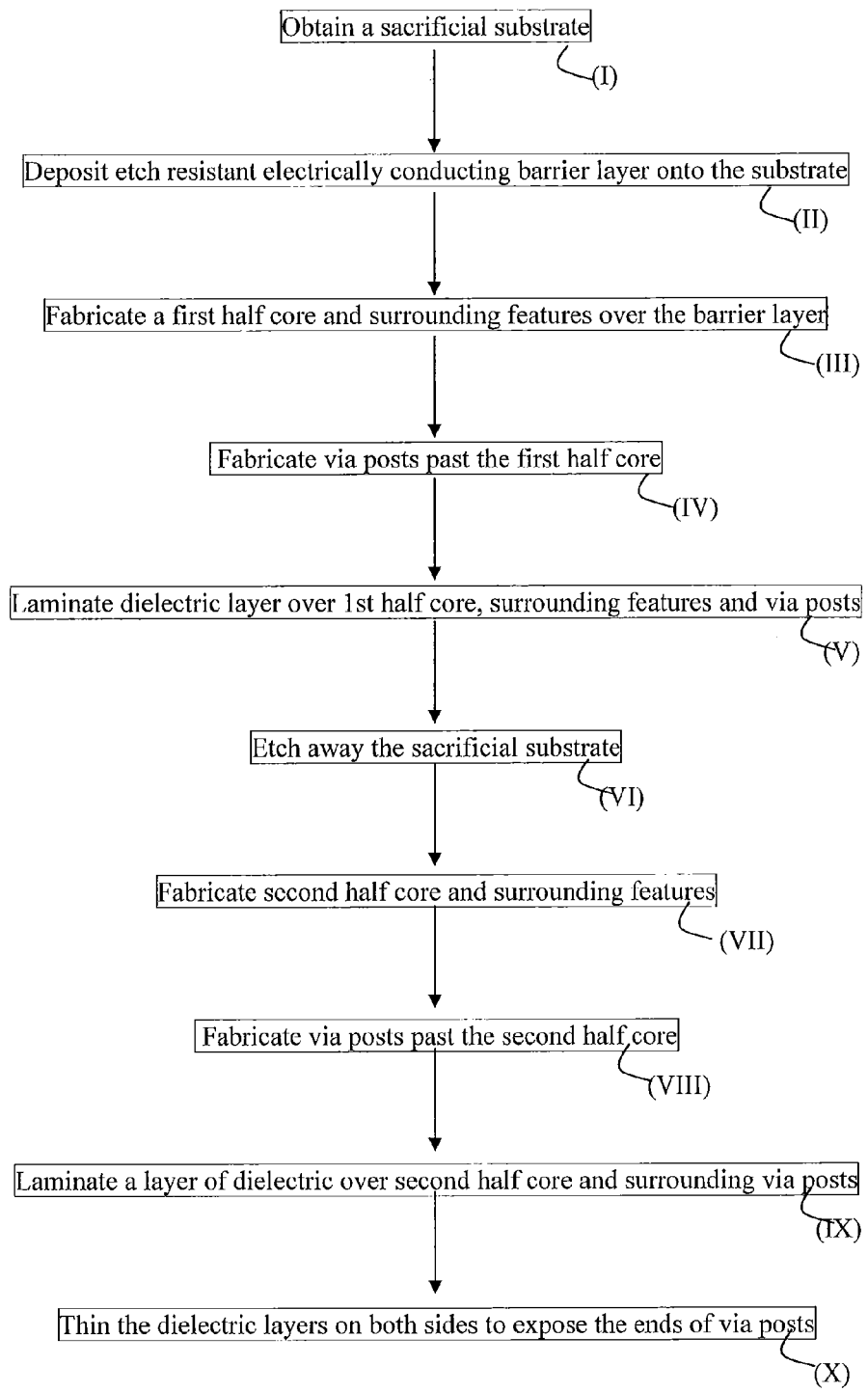
FIG. 3 is a generalized flowchart of a method for creating a substrate with integral core, such as that shown in FIG. 4(*xv*)

A generalized method for fabricating the central region 222 of an interconnect structure 200 with an integral metal core 224 is shown in FIG. 3. The generalized method comprises the steps of:

I) Obtaining a sacrificial substrate;
II) depositing a barrier layer that is etchant resistant and electrically conducting onto the sacrificial substrate;
III) Fabricating a first half core and surrounding features or pads over the barrier layer, typically by electroplating;

IV) Fabricating (typically by electroplating) via posts past the first half core, V) laminating a first dielectric layer over the first half core and surrounding posts;

VI) etching away the sacrificial substrate;

VII) fabricating a second half core and surrounding features or pads by electroplating;

VIII) fabricating via posts that extend past the second half core;

IX) laminating a layer of dielectric over the second half core, surrounding pads and via posts, and X) thinning the dielectric layers on both sides to expose the ends of via posts.

Figure 4I:
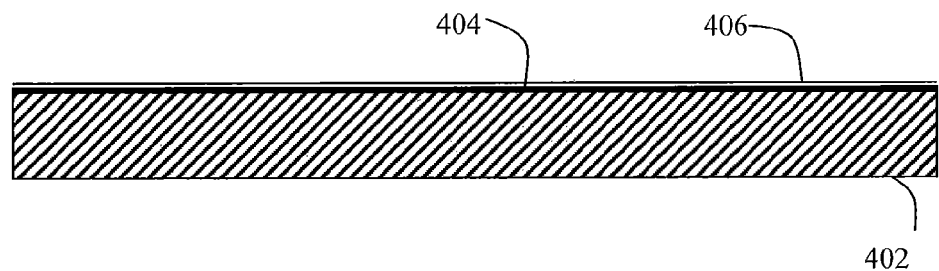
FIGS. 4(*i*) to 4(*xv*) are schematic illustrations of intermediate structures.
Figure 4:
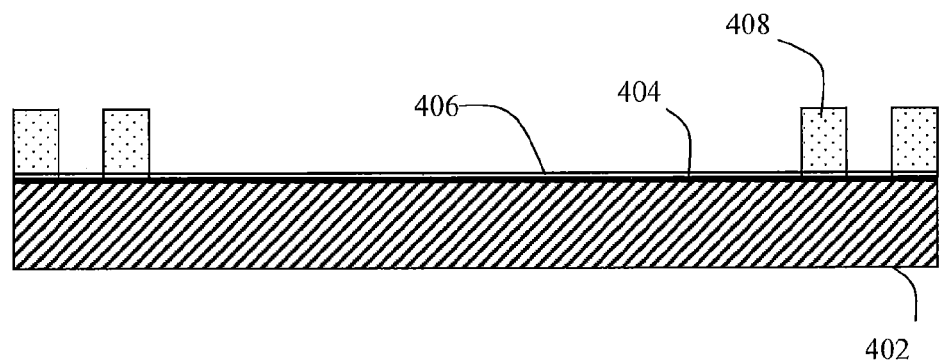
Figure 4:
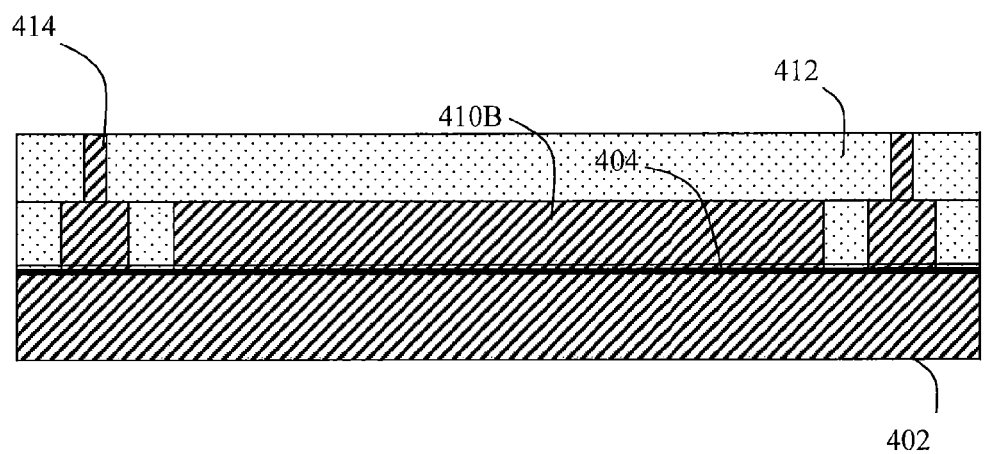
Figure 4V:
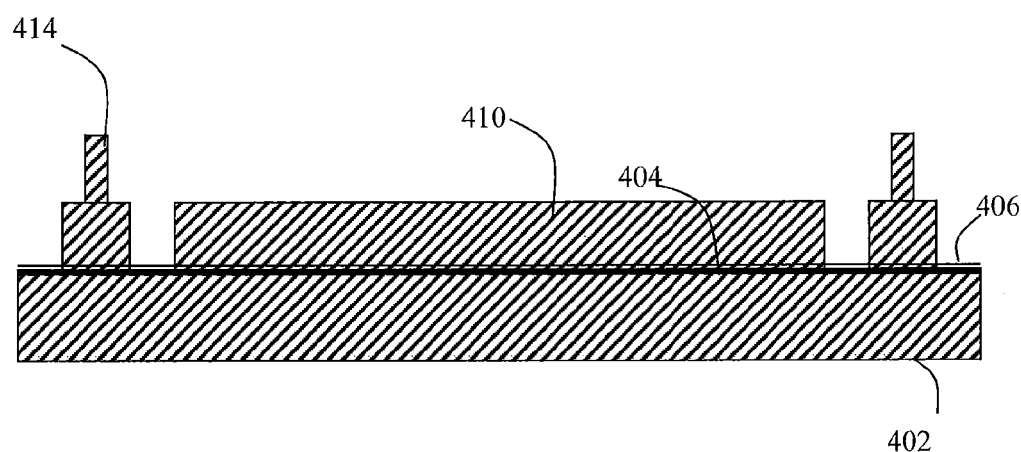
Figure 4:
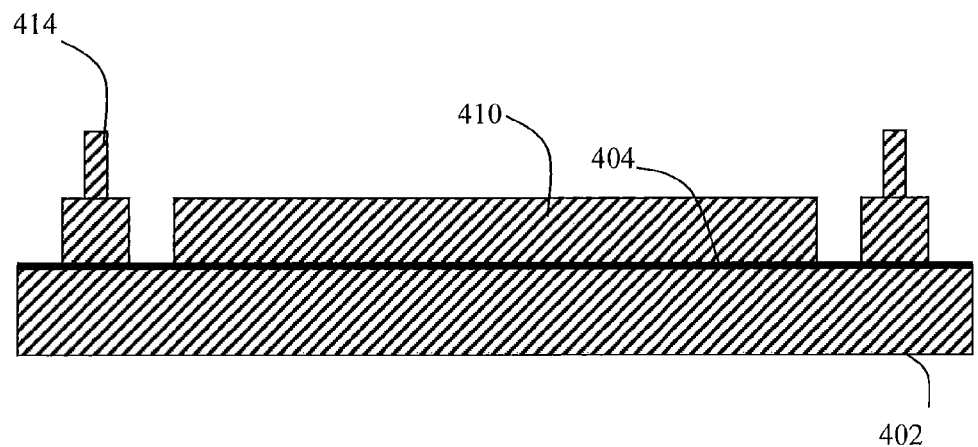
Figure 4:
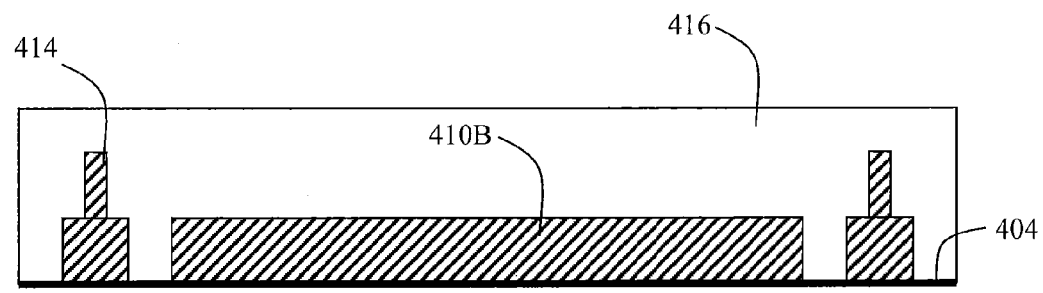
Figure 4:
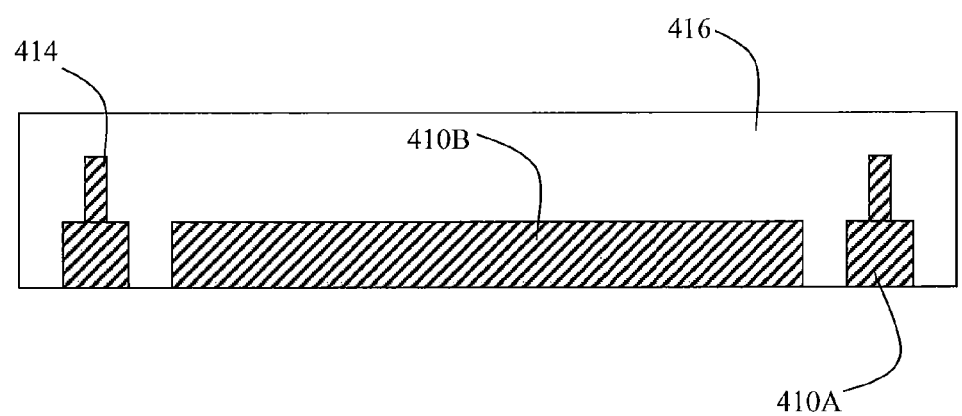
Figure 4X:
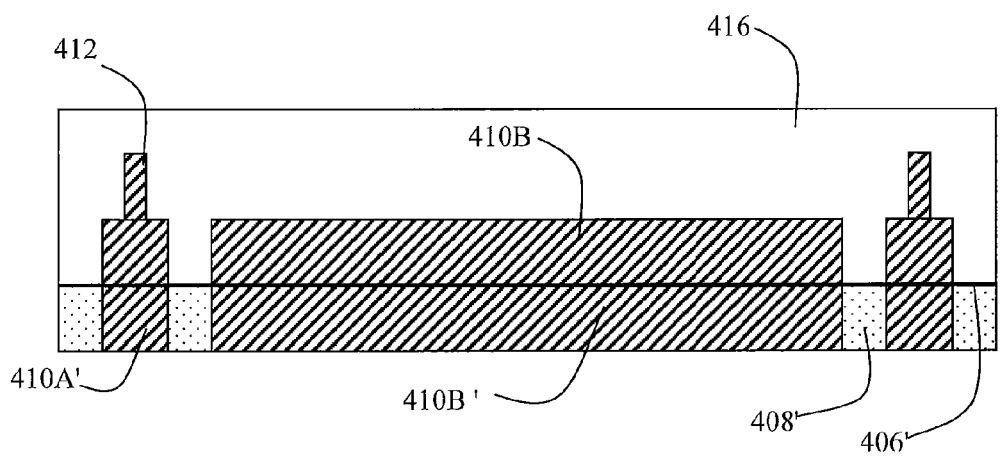
Figure 4:
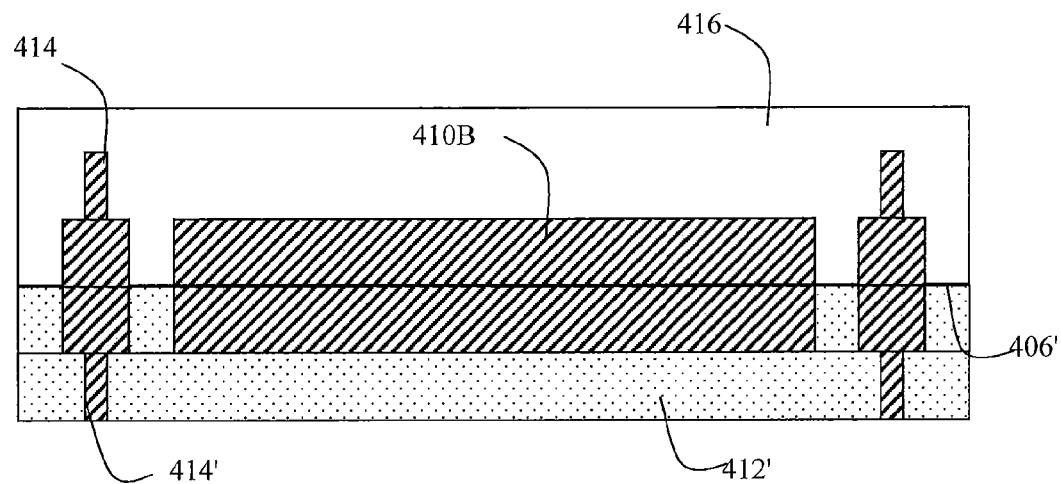
Figure 4:
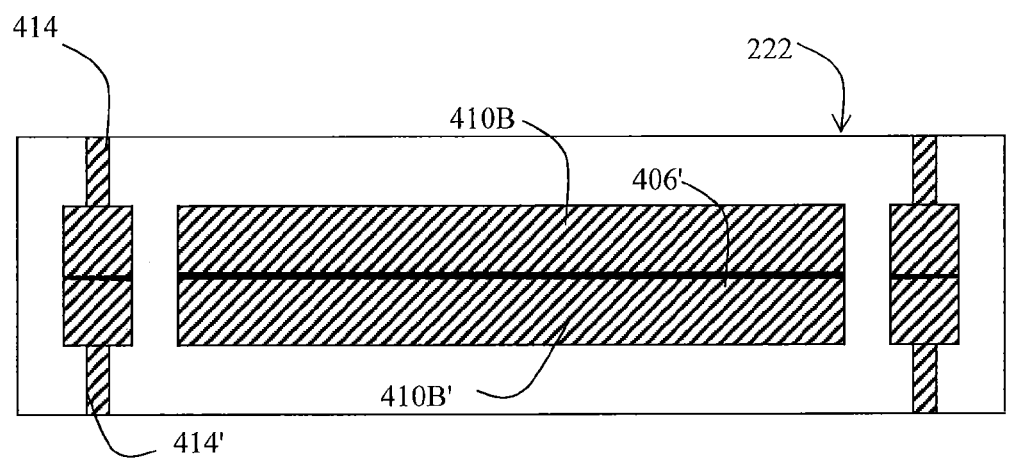
Figure 4A:
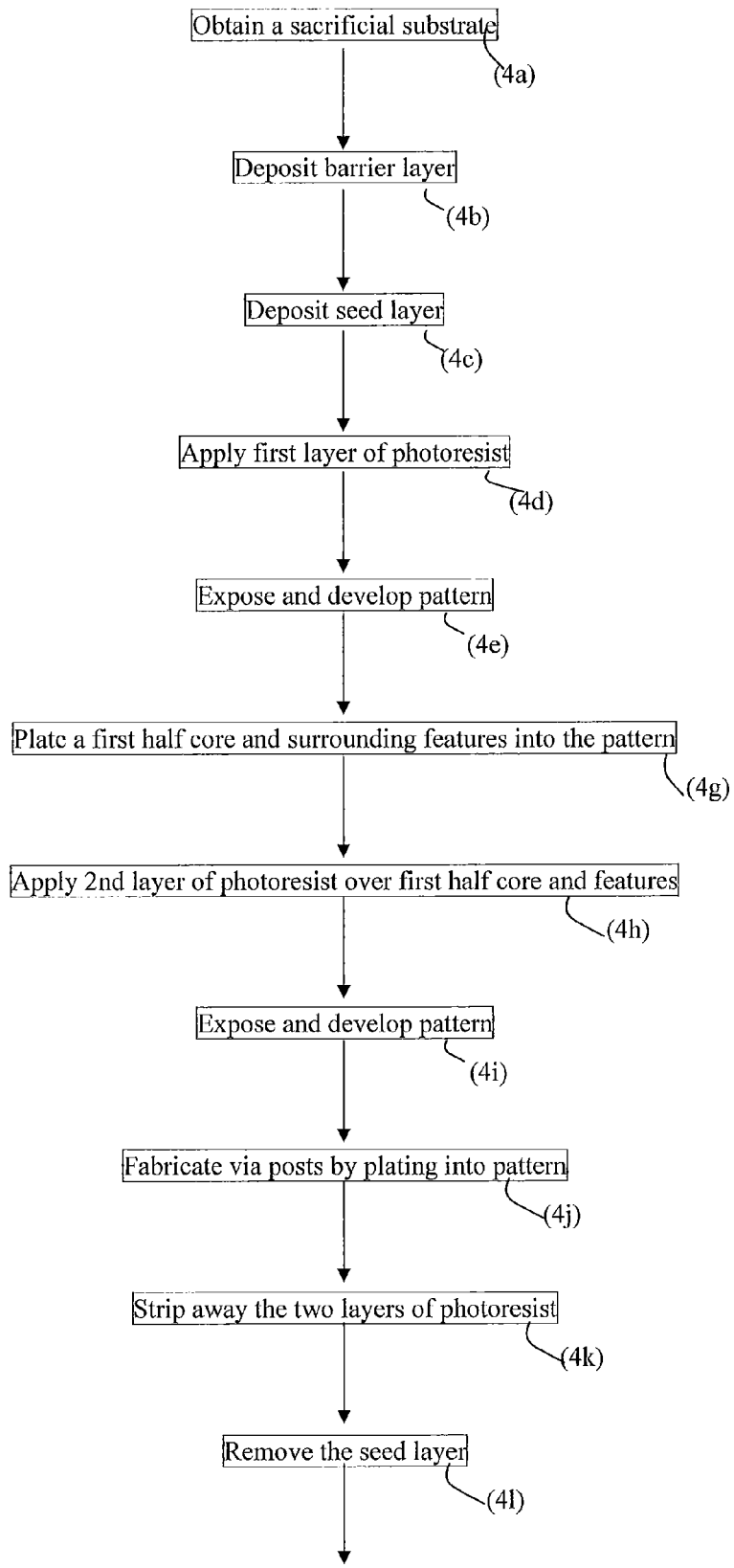
Figure 4B:
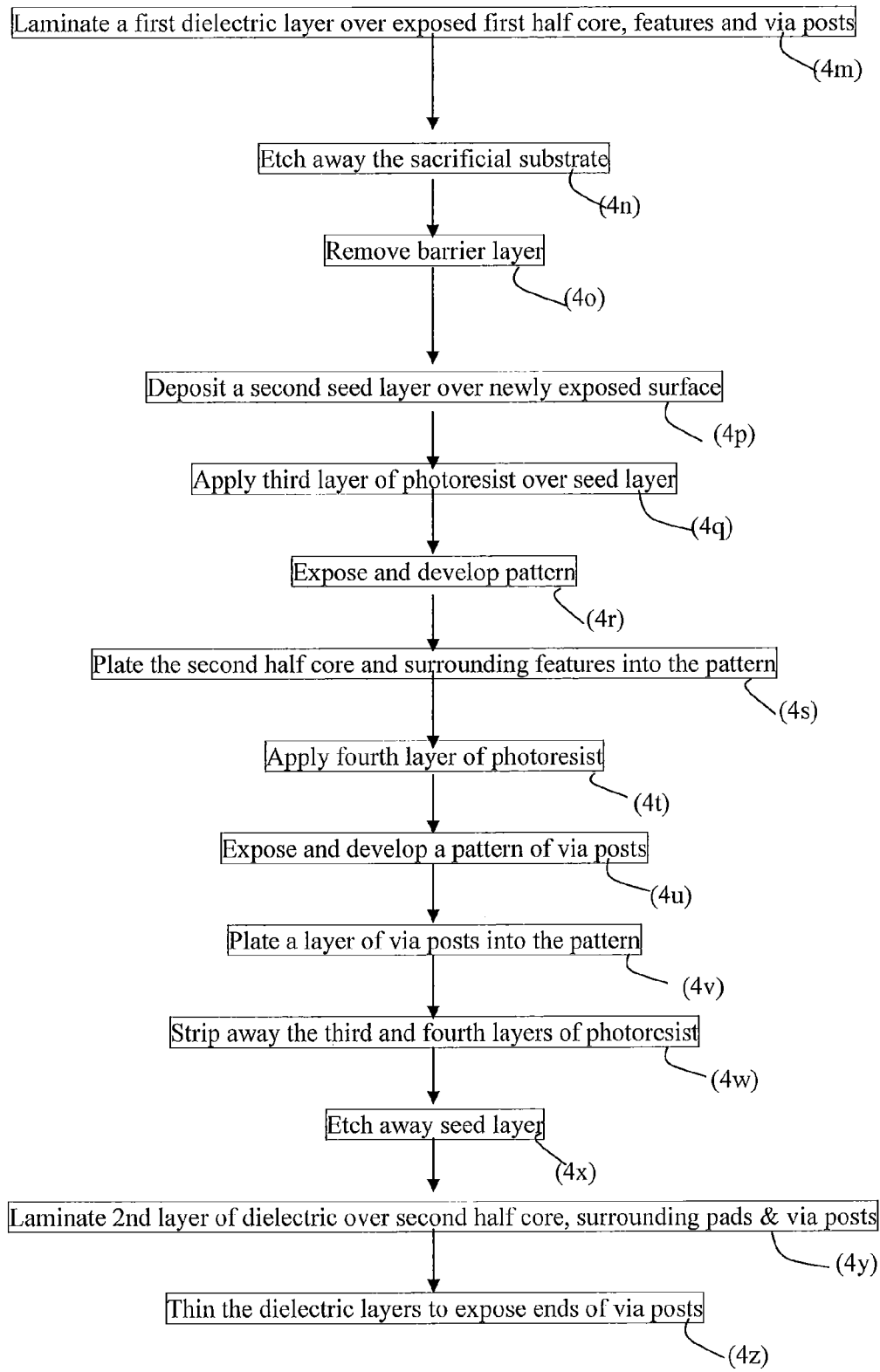

For purposes of enablement, with reference to FIGS. 4(*i*) to 4(*xv*), and with further reference to the flowchart of FIG. 4, one detailed method of fabricating interconnects with a thin metal core is described.

Firstly a sacrificial substrate 402 is obtained—step (4*a*), and a barrier layer 404 that is etchant resistant and electrically conducting is deposited onto the flat metallic substrate 402—step (4*b*). The barrier layer 404 may be nickel, gold, a nickel layer followed by a gold layer, a gold layer followed by a nickel layer, tin, lead, a tin layer followed by a lead layer, tin-lead alloy, and tin silver alloy and may be applied by a plating method such as electroplating or electroless plating, for example. Typically the barrier layer will be 0.1 µm to 10 µm thick.

A seed layer 406 is then deposited onto the barrier layer 604—step (4*c*). The resultant structure is shown in the schematic illustration of FIG. 4(*i*). The seed layer may be deposited by sputtering or electroless plating for example and is typically 0.5 to 1.5 microns thick.

A first layer of photoresist 408 is applied—step (4*d*) and exposed and developed to form a negative pattern of trenches including a large central region (4*e*)—as shown in FIG. 4(*ii*). A metal layer 410 is deposited into the pattern—step (4*g*). The metal layer includes a central half core 410B and surrounding features or pads 410A. The resultant intermediate structure is schematically illustrated in FIG. 4(*iii*).

As schematically illustrated in FIG. 4(*iv*), a second layer of photoresist 412 is applied (4*h*) and exposed and patterned—step (4*i*), and a second metal layer 414 typically comprising via posts that is typically copper, is electroplated into the pattern—step (4*j*). See schematic illustration in FIG. 4(*iv*). The first and second layers of photoresist 408, 412 are stripped away—step (4*k*), leaving the structure schematically shown in FIG. 4(*v*).

There are now several variant routes for further fabrication. In the first, described below, with reference to FIGS. 4(*vi*) to 4(*xv*) and with further reference to FIG. 4, the copper seed layer 406 is removed—step (4*l*). This may be achieved with any copper specific etchant, the underlying barrier layer 404 resisting the etch and protecting the sacrificial substrate 202. See FIG. 4(*vi*).

A dielectric material 416 is laminated over the upstanding deposited copper 410, 414, thereover—step (4*m*). Typically the dielectric material 416 is a prepreg consisting of woven bundles of glass fibers in a polymer resin that itself contains ceramic particle fillers. The resultant structure is shown in FIG. 4(*vii*).

The sacrificial substrate 402 is now etched away—step (4*n*). The resultant intermediate structure is schematically illustrated in FIG. 4(*viii*).

The barrier layer 404 may now be selectively removed—step (4*o*). Selective processes for removing the barrier layer 404 without harming the previously deposited copper 410, 414 are known. For example, Ti, W, Ta may be selectively removed leaving Cu using a plasma etch comprising $CF_4/O_2$ or $CF_4/Ar$. Alternatively, a 1-3% HF solution is very effective in removing Ti, leaving copper. Similarly, if barrier layer is nickel, a selective nickel stripper as known, may be used. Each barrier layer is removed with an appropriate etchant as known. The resultant structure is shown in FIG. 4(*ix*).

With reference to the schematic illustration of FIG. 4(*x*), a second seed layer 406' may now be deposited over the exposed copper and dielectric—step (4*p*). The second seed layer 406' may be deposited by sputtering or electroless plating for example and is typically 0.5 microns to 1.5 microns thick. A third layer of photoresist 408' may be applied over the second seed layer 406'—step (4*q*) and patterned with a negative pattern of trenches and a central area—step (4*r*) into which metal 410', including a second half core 410B', typically copper, may be electroplated—step (4*s*).

A fourth layer of photoresist 412' is deposited over the third layer of photoresist 408' (4*t*) and a second pattern is developed therein—step (4*u*), into which copper vias 414' may be deposited—step (4*v*), see schematic illustration of FIG. 4(*xi*). The third and fourth layers of photoresist 408', 412' are then stripped away—step (4*w*), leaving structure shown in FIG. 4(*xii*). The seed layer 406' is then etched away—step (4*x*) leaving structure shown in FIG. 4(*xiii*). This may be accomplished by exposing the structure to a wet etch of ammonium hydroxide or copper chloride, for example. A dielectric layer 416 is laminated over the upstanding copper—step (4*y*). The resultant intermediate structure is schematically illustrated in FIG. 4(*xiv*). The dielectric layer is then thinned to expose ends of via posts—step (4*z*). The resultant intermediate structure is schematically illustrated in FIG. 4(*xv*).

The core has a thickness of two via posts, and typically has a thickness of less than 100 microns. The basic four layer structure shown in FIG. 4(*xv*), which is essentially the region 222 of FIG. 2, is typically about 200 microns thick. In this embodiment, the central layer 205 is a seed layer and if copper, may only be distinguishable from the electroplated copper 210B, 210B' therearound by the sputtered of electroless plated copper having a different microstructure from the electroplated copper. The seed layer 205 may, however, include an underlying adhesion layer of titanium, tungsten, tantalum or chromium may be first applied. Such an adhesion layer is typically 0.04 microns to 0.1 microns thick.

Figure 5A:
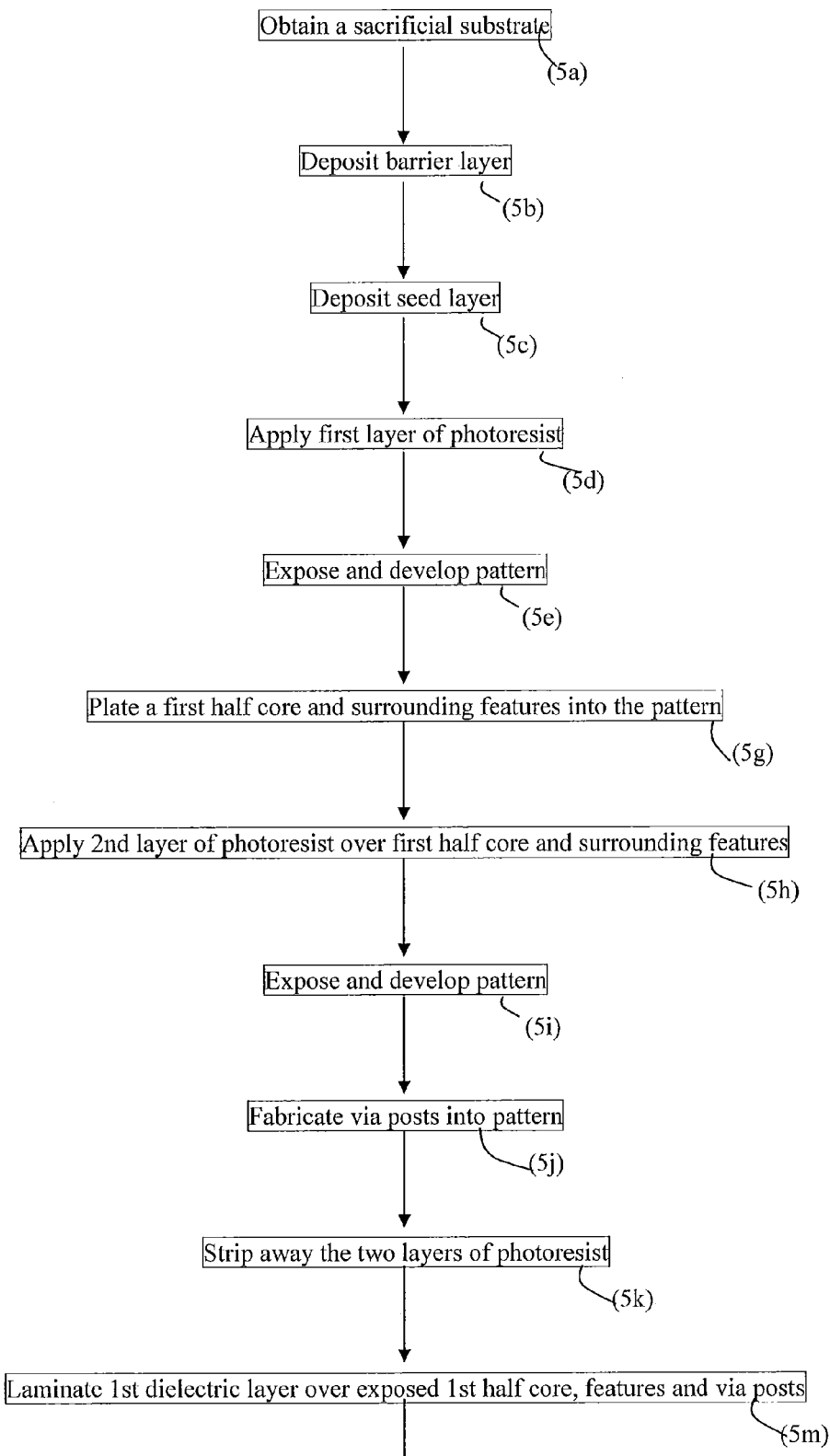
FIG. 5 is a detailed flowchart of a variant method to that shown in FIG. 4.
Figure 5B:
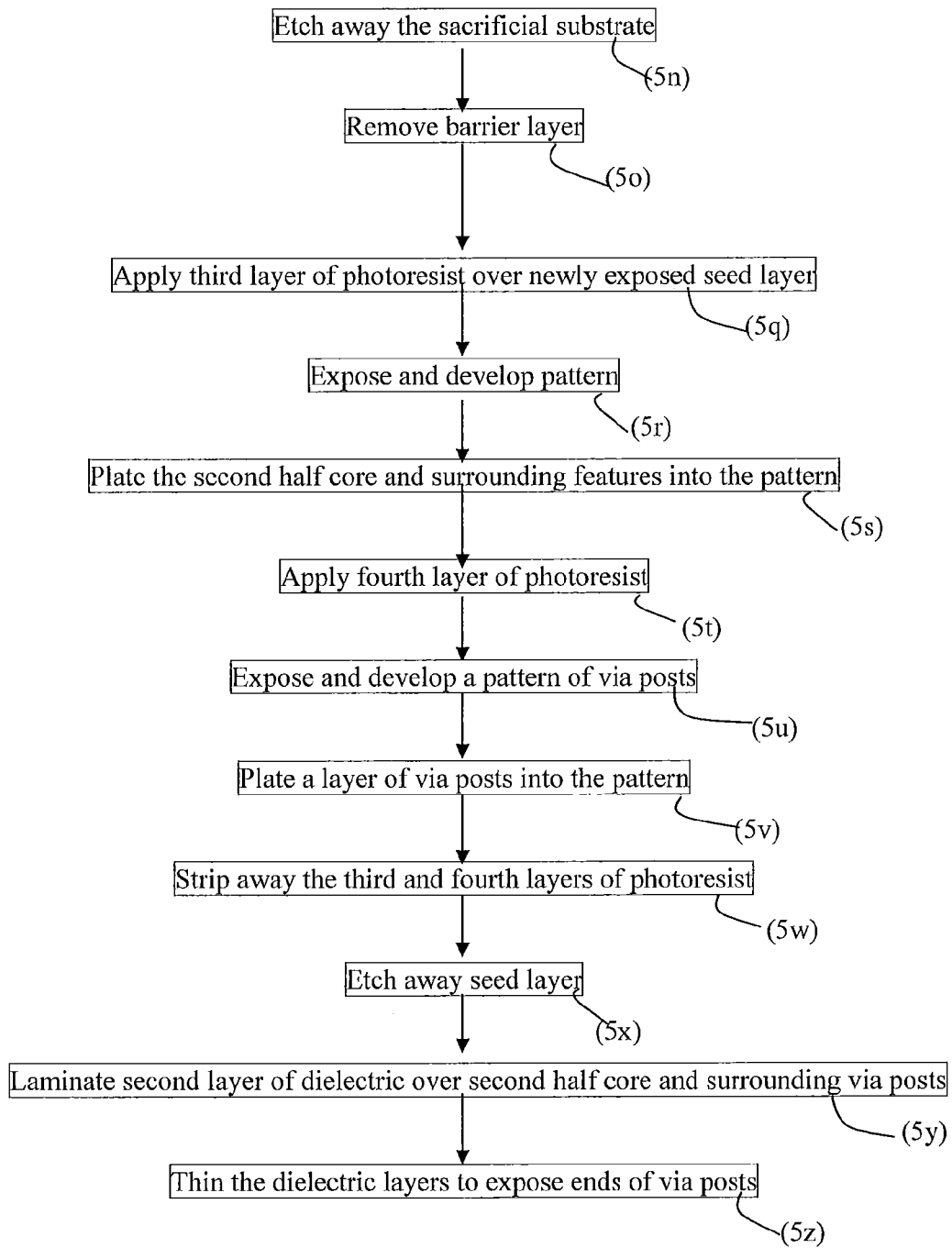

With reference to FIG. 5, in one variant method, the first seed layer is not removed, and after removal of the barrier layer in step (5*o*) the third layer of photoresist is deposited over the underside of the first seed layer. Thus in flowchart 5 a method without steps (l) of removing the first seed layer, and (p) of applying a second seed layer is described.

Figure 6I:
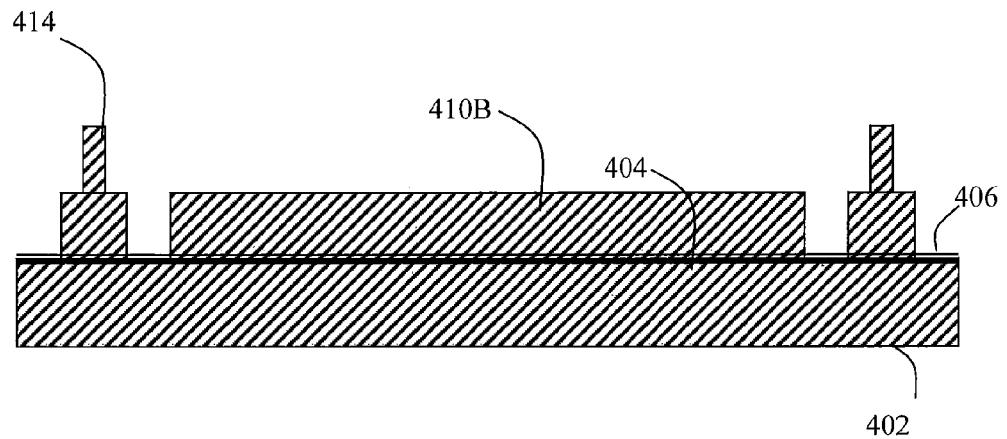
FIGS. 6(*i*) to 6(*x*) are schematic illustrations of intermediate structures.
Figure 6:
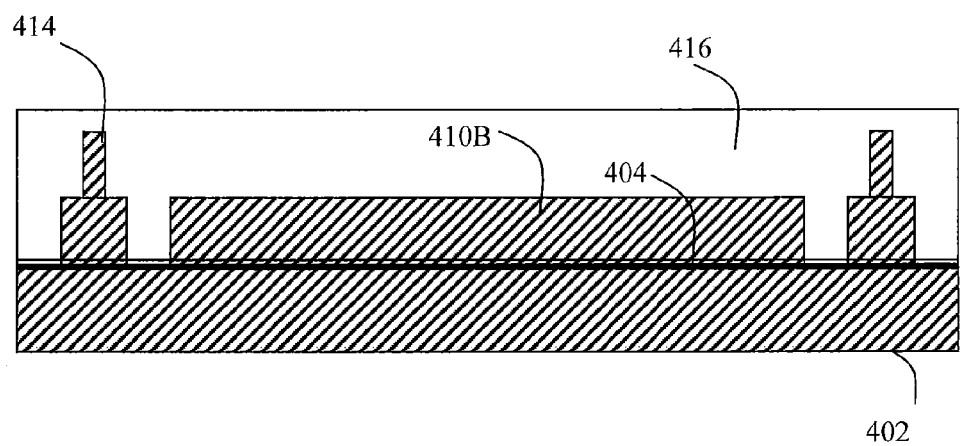
Figure 6:
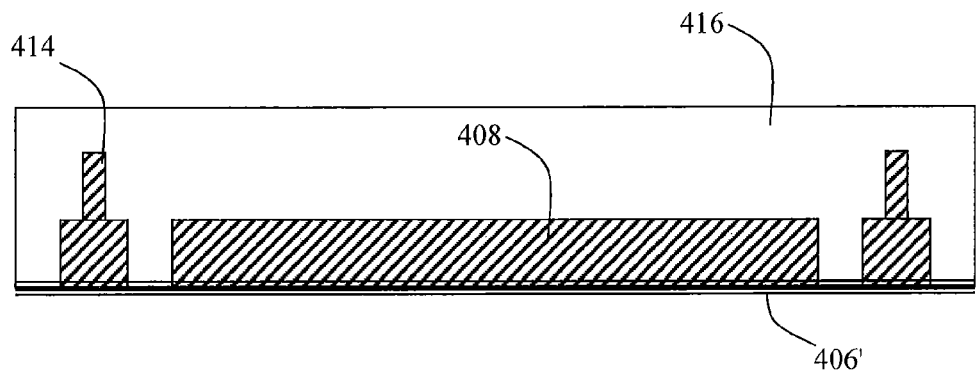
Figure 6V:
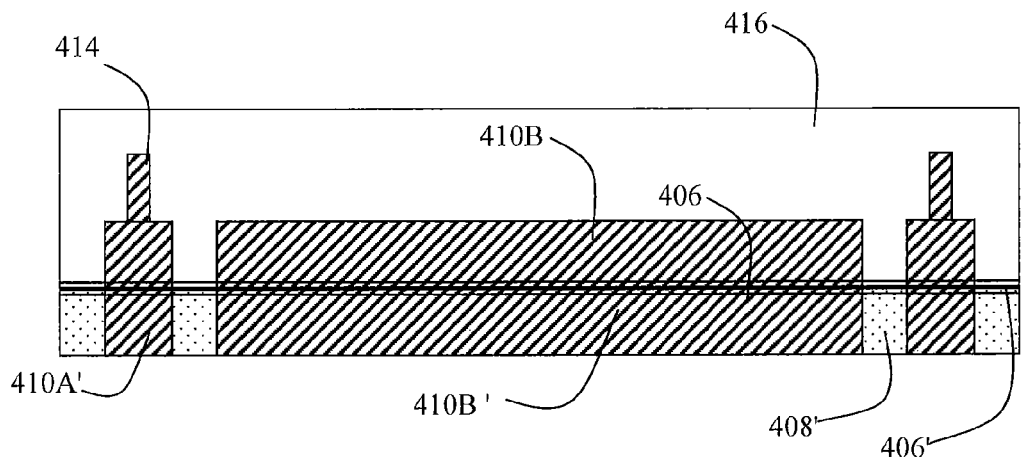
Figure 6:
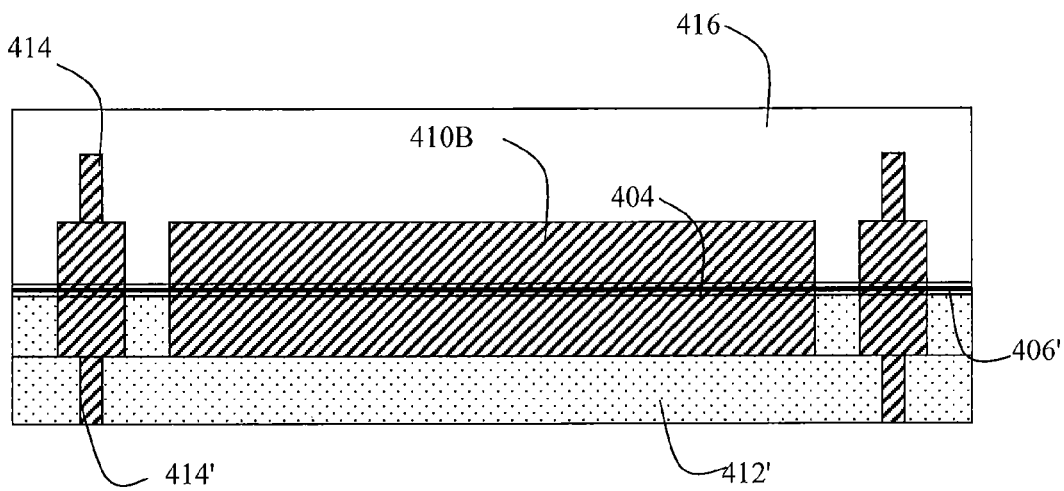
Figure 6:
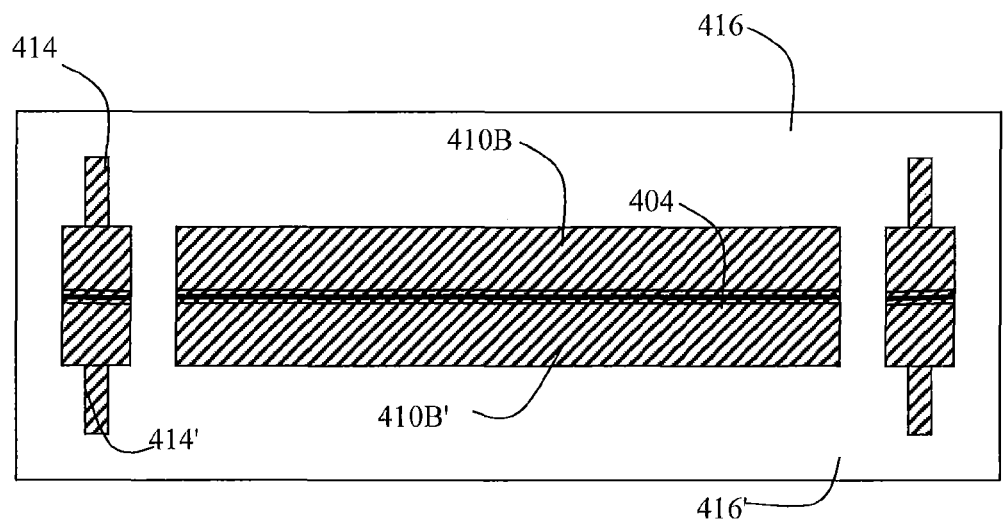
Figure 6X:
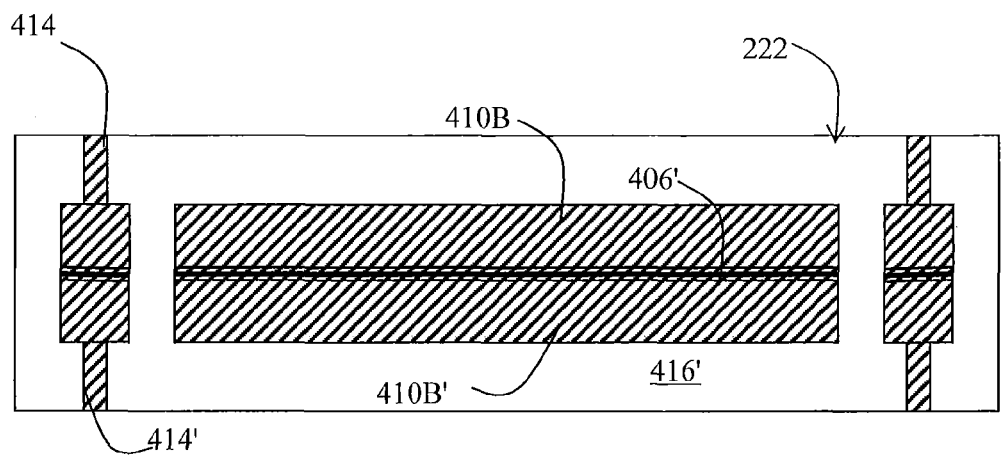
Figure 6A:
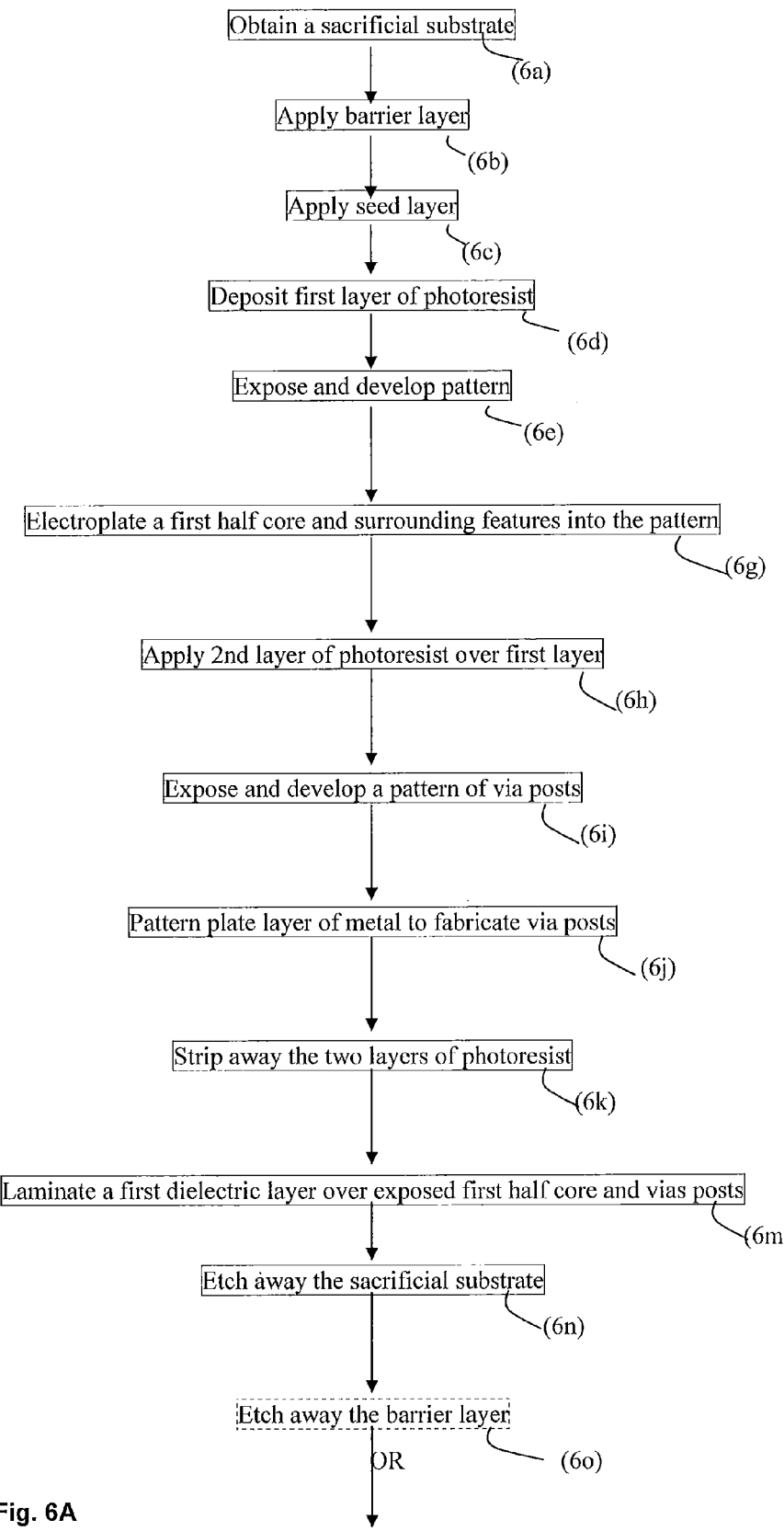
Figure 6B:
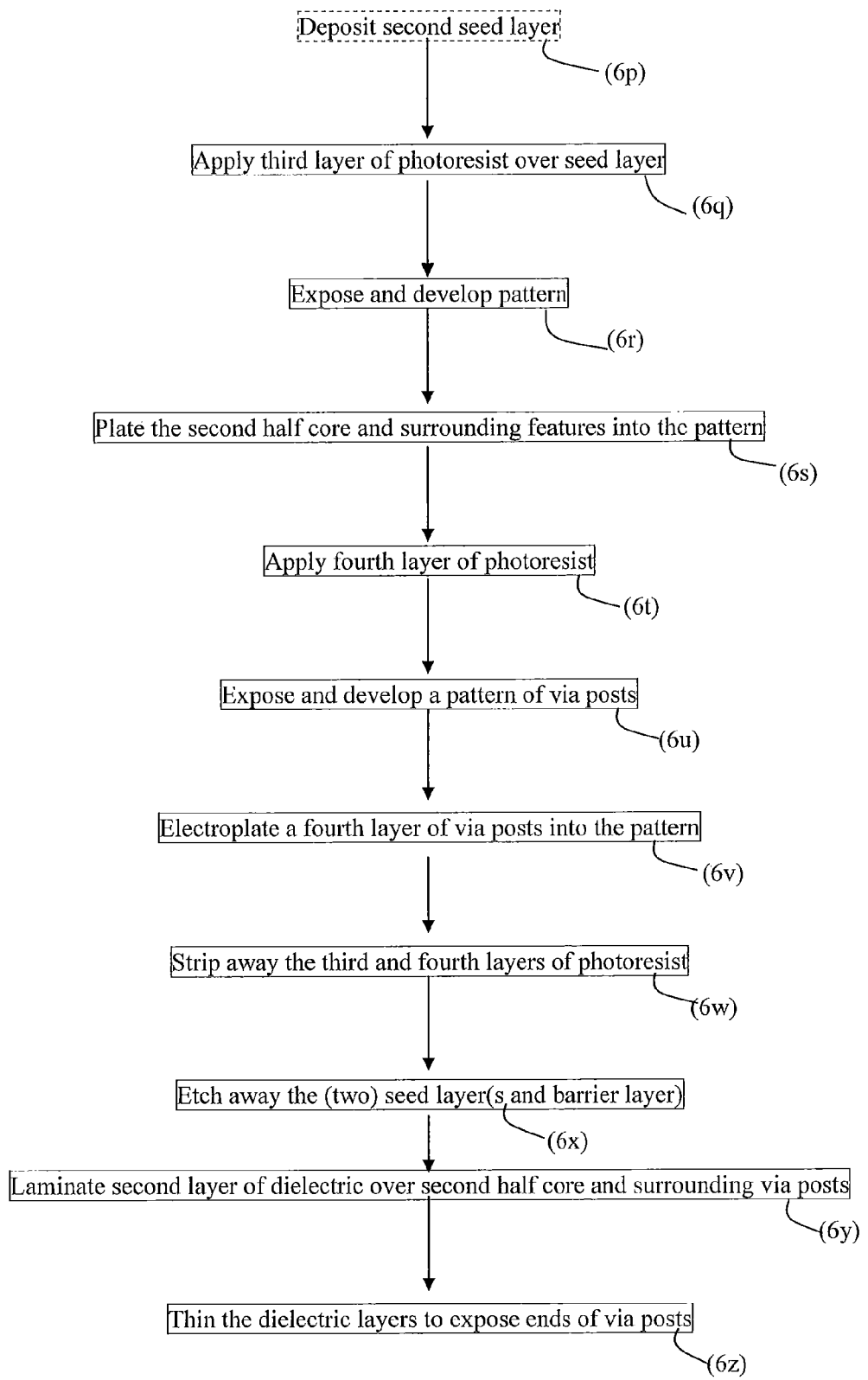

With reference to schematic illustrations FIGS. 6(*i*)-6(*x*) and with further reference to the flowchart of FIG. 6, in a variant manufacturing technique, Steps (6*a*) to (6*k*) are identical to steps (4*a*) to (4*k*) mutatis mutandis, providing the structure shown in FIG. 6(*i*) which is identical to that of FIG. 4(*v*) mutatis mutandis.

Instead of step (4*l*) removing the seed layer 406, the dielectric material 416 is simply laminated over the seed layer 406—step (6*m*), providing the structure shown in FIG. 6(*ii*). Next the sacrificial substrate 402 is removed—step (6*n*), perhaps using a wet etch such as ammonium hydroxide or copper chloride, for example, with the barrier layer 404 protecting the first half core 40B and the vias 410A, 414. The resulting structure is shown in FIG. 6(*iii*).

The barrier layer may be removed—step (6*o*), exposing the underside of the seed layer 406.

Alternatively, as shown in FIG. 6(*iv*), instead of removing the barrier layer in step (6*o*), a second seed layer may be deposited onto the underside of the barrier layer 404—step (6*p*). The seed layer 406' may be deposited using sputtering, electroless plating, PVD, etc.

Either way, a third layer of photoresist 408' may now be applied—step (6*q*) and a pattern exposed and developed thereinto—step (6*r*), and copper 410A', 410B' electroplated into the pattern—step (6*s*). The resulting structure is shown in FIG. 6(*v*). A fourth layer of photoresist 412' may be deposited thereover—step (6*t*) and a pattern developed therein—step (6*u*). Copper via posts 414' may be deposited into the pattern in the photoresist 412'—step (6*v*). The resulting structure is shown in FIG. 6(*vi*).

The photoresist 408', 412' may be stripped away—step (6*w*), leaving the second half of the core 410B' and surrounding elements 410B', 414' upstanding. See FIG. 6(*vii*).

Now, both the second seed layer 406' and the barrier layer 404 and the first seed layer 406 may be etched away—step (6*x* and 6*x*2), giving the structure as illustrated in FIG. 6(*viii*).

A dielectric material 416' may be laminated over the upstanding central core 410B' and surrounding elements 410A', 414'—step (6*y*) providing the structure illustrated in FIG. 6(*ix*). The structure may be thinned—step (6*z*) on both sides, providing the structure shown in FIG. 6(*x*).

Additional layers may be built up on one or both sides, by pattern or panel plating. Thus the electrodeposited core structure need not be in the symmetrical center of the support structure thus formed.

Figure 7A:
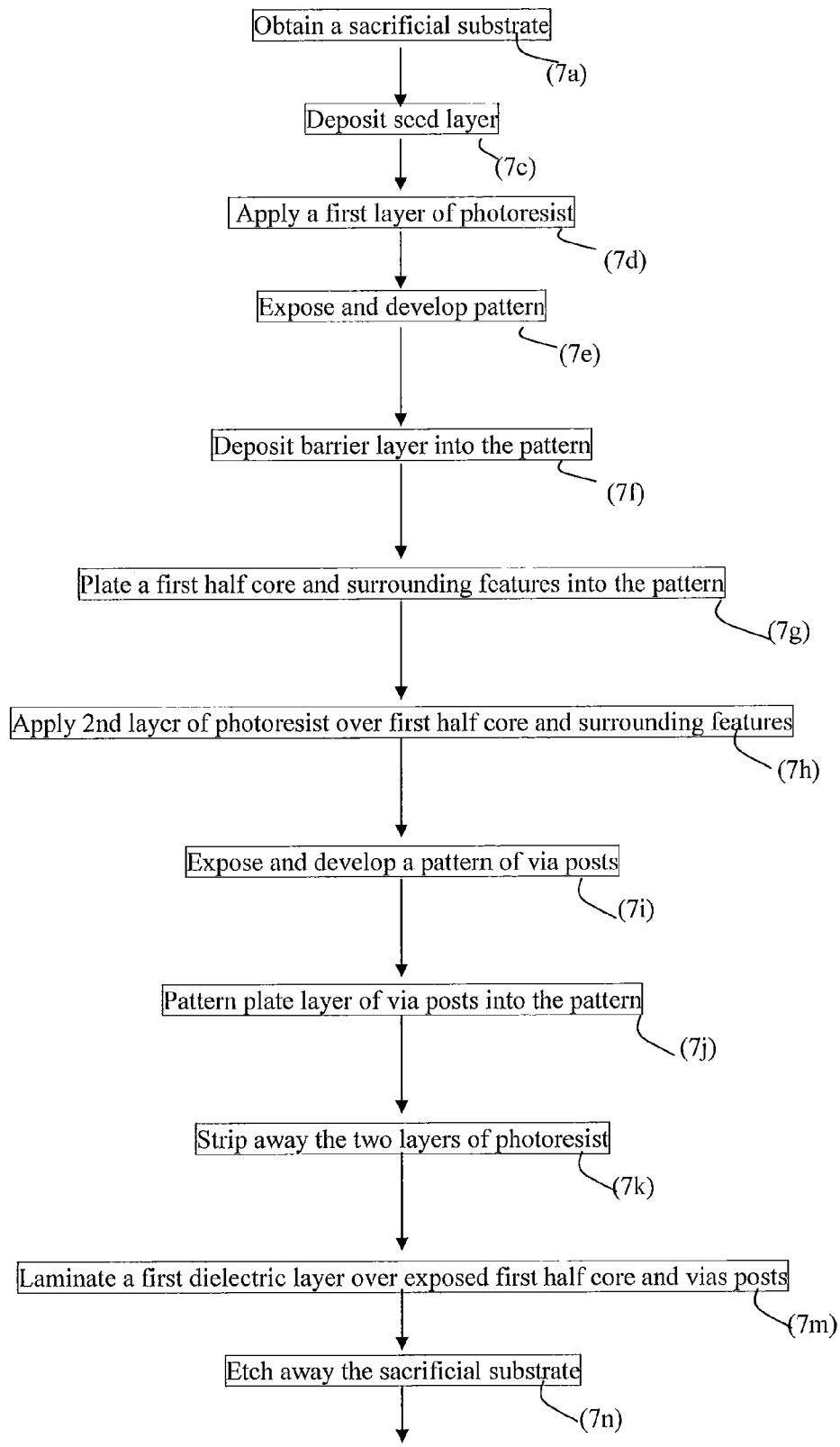
FIG. 7 is a detailed flowchart of a variant method generally in accordance with FIG. 3.
Figure 7B:
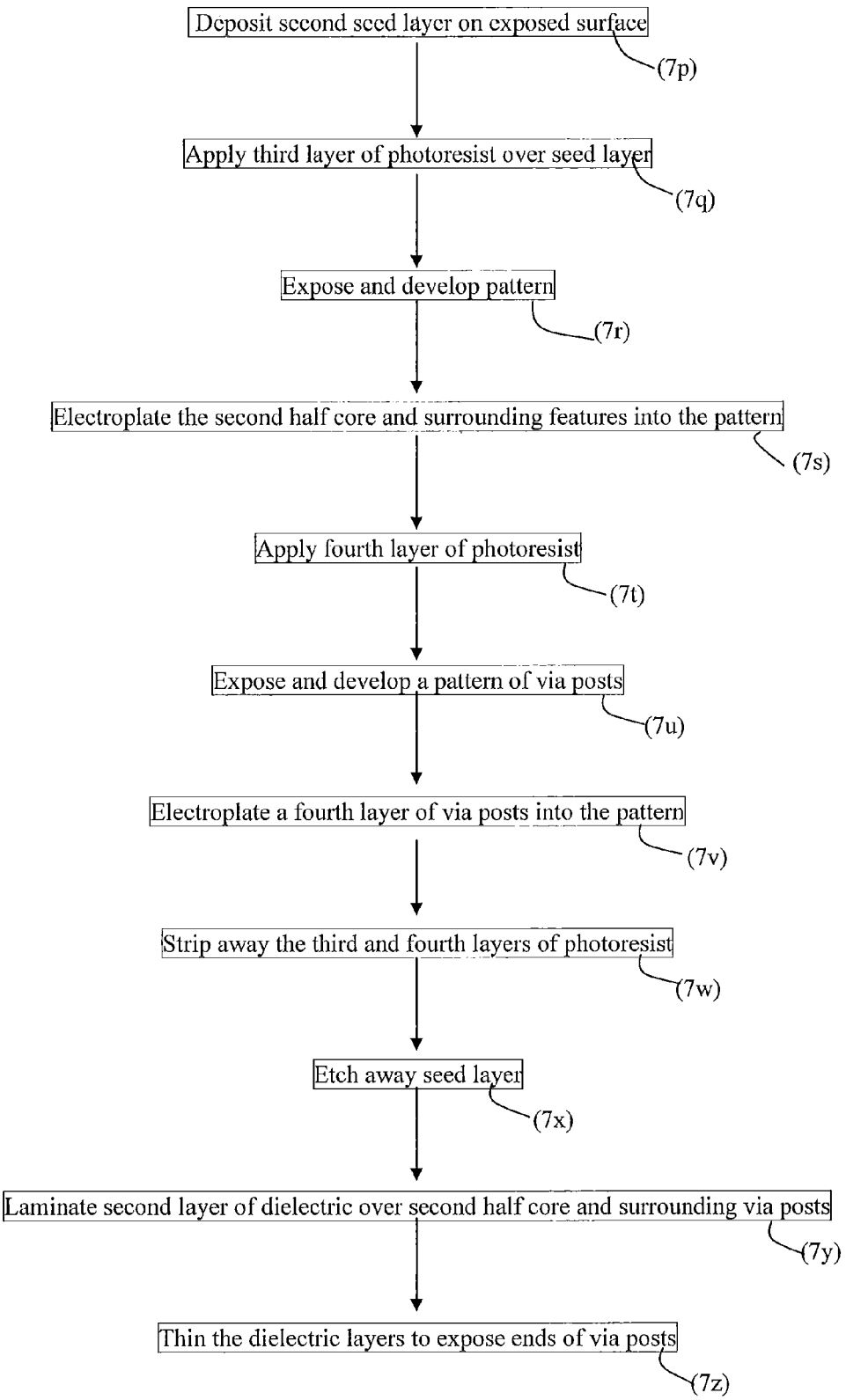

With reference to the flowchart of FIG. 7, in yet another variant process, instead of panel-plating the barrier layer i.e. step (b) above, between steps (a) and (c), a barrier layer may be pattern-plated into the first photo-resist layer in step (f) after developing the photoresist and before electroplating the first half core. A second seed layer will be deposited (step p) after removing the sacrificial substrate (step n) and before applying the third layer of photoresist. In such embodiments, the pattern plated barrier layer will generally not be stripped away and will, instead, be included as a layer separating the two sections of the metal core.

In all embodiments, where the pattern in the third layer of photoresist is not properly aligned with the pattern in the first layer, there may be a slight mismatch between the two sections of the central core, providing a small but noticeable step along one or more edges of the central core. The microstructure of the seed layer is slightly different to that of the plated core sections, but it may be difficult to discern the difference since sectioning may smear the soft copper. Where an adhesion layer is used, or where the barrier layer leaves remains or leaves traces, it may be possible to determine non copper metal along the join between the two sections.

Figure 8:
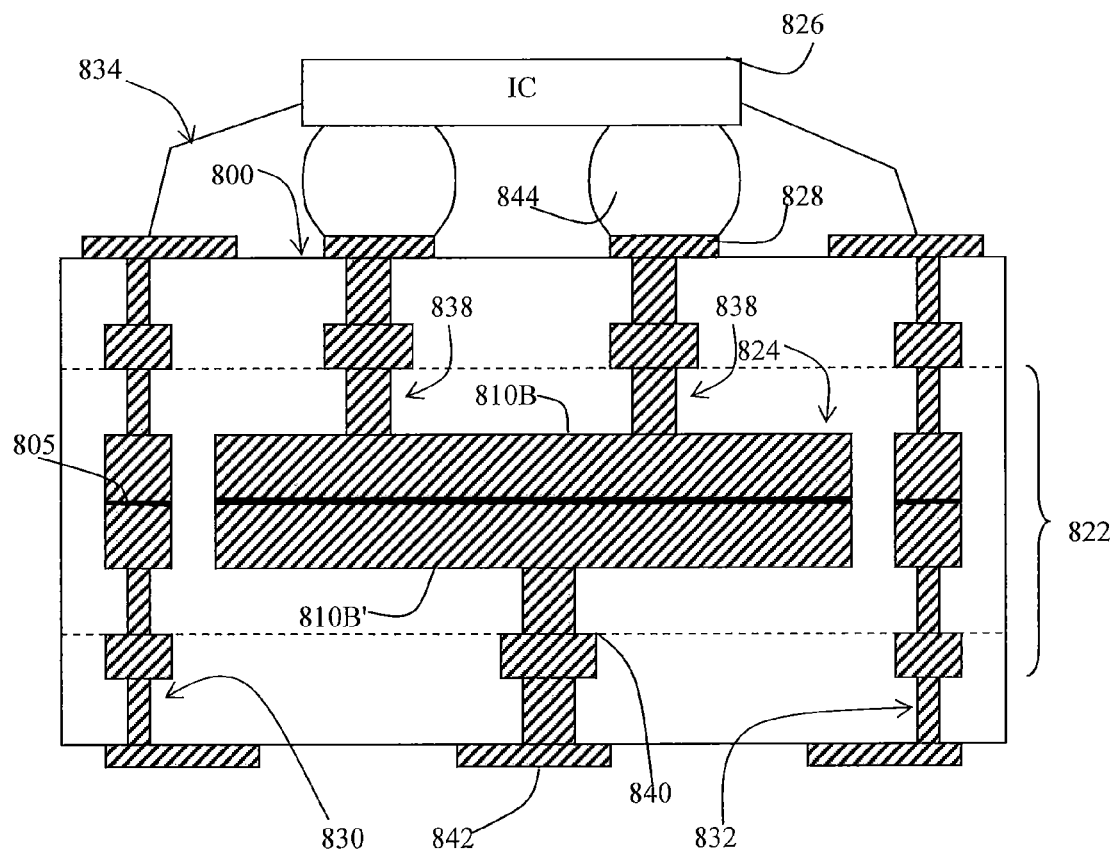
FIG. 8 is a second example of a structure that may be fabricated by the methods described herein.

Referring to FIG. 8, a multilayer electronic interconnect support structure 800 in accordance with one embodiment of the invention is shown. Multilayer electronic interconnect support structure 800 is characterized by including a central region 822 that includes a core 824, consisting of two electroplated layers 810B, 810B' around a central layer 805, that may optionally be a seed layer of copper, and optionally further include an adhesion metal layer such as titanium, tantalum, tungsten or chromium and/or a barrier layer such as Nickel, Gold, a Nickel layer followed by a Gold layer, a gold layer followed by a Nickel layer, Tin, Lead, a Tin layer followed by a Lead layer, Tin-Lead alloy, and Tin Silver alloy. A chip 826 may be attached to terminal pads 828 by soldering or with a heat conductive adhesive 844 for example. Conventional structures 830, 832 consisting of vias and feature layers on one and preferably more than one side thereof, perhaps around the perimeter thereof, may be provided for electrically connecting to the chip 826 using wire bonds 834, for example.

Although seed layers that may be sputtered or electroless plated are required to electroplate over dielectric, and adhesion layers may also be used, for simplicity, apart from layer 805, these are not shown in FIG. 8.

Terminal pads 828 may be coupled by conventional structures 838 of vias and pads to the central core 824, and the core 824 may be coupled by a further convention structure via 840 to a lower pad 842 which may be connected to a heat sink or be otherwise cooled. Thus although the terminal pads 828 and central core 824 may not serve an electronic connective function, they may, nevertheless, serve a heat conductive function to cool a chip 826, as well as to provide mechanical support.

The ability of the cored electronic support structure to enhance heat dissipation from the chip or device through the metal core by an interconnecting stack of via posts as shown in FIG. 8, is not only through the z axis of the substrate itself but also through its XY planes assisted by the relatively large metal mass of the central metal core.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A multilayer electronic support structure comprising a dielectric with integral vias and feature layers and further comprising a planar metal core characterized by a thickness of less than 100 microns that comprises two sections separated by a copper seed layer wherein the two sections are imperfectly aligned such that there is a step along at least one edge at the seed layer.

2. The multilayer electronic support structure of claim 1 wherein the planar metal core is totally encapsulated.

3. The multilayer electronic support structure of claim 1 wherein the planar metal core comprises copper.

4. The multilayer electronic support structure of claim 1 wherein the two sections are further separated by a submicron adhesion metal layer comprising at least one of the group consisting of chromium, tantalum, titanium and tungsten.

5. The multilayer electronic support structure of claim 1, wherein the planar metal core further comprises a central barrier metal layer separating the two sections.

6. The multilayer electronic support structure of claim 5 wherein the central barrier metal layer is selected from the group consisting of nickel, gold, a nickel layer followed by a gold layer, a gold layer followed by a nickel layer, tin, lead, a tin layer followed by a lead layer, tin-lead alloy, and tin silver alloy and is applied by a plating method selected from the group consisting of electroplating, electroless plating and PVD.

7. The multilayer electronic support structure of claim 1, wherein the dielectric material comprises a polymer.

8. The multilayer electronic support structure of claim 7, wherein the polymer comprises polyimide, epoxy, Bismaleimide, Triazine and blends thereof.

9. The multilayer electronic support structure of claim 7, wherein the dielectric material further comprises inorganic inclusions.

10. The multilayer electronic support structure of claim 7, wherein the inorganic inclusions comprise at least one of glass fibers and particle fillers.

11. The multilayer electronic support structure of claim 1, wherein the planar metal core is less than 80 microns thick.

12. The multilayer electronic support structure of claim 1, wherein the integral via and feature layers comprise copper.

13. The multilayer electronic support structure of claim 1, wherein the structure is built substantially symmetrically around the planar metal core, having similar numbers of layers on each side of the planar metal core.

14. The multilayer electronic support structure of claim 1, wherein the structure is built asymmetrically around the planar metal core, having dissimilar numbers of layers on each side of the planar metal core.

15. The multilayer electronic support structure of claim 1, wherein the planar metal core is thermal conductively coupled to at least one outer surface of the multilayer electronic support structure and serves as a heat sink.

16. A process of fabricating a multilayer electronic support structure with an integral planar metal core that comprises two sections separated by a copper seed layer wherein the two sections are imperfectly aligned such that there is a step along at least one edge at the seed layer comprising the steps of:
Obtaining a sacrificial substrate;
depositing an etchant resistant electrically conducting barrier layer onto the sacrificial substrate;
fabricating a first half core and surrounding features over the barrier layer;
fabricating via posts past the first half core and surrounding features;
laminating a first dielectric layer over the first half core, surrounding features and via posts;
etching away the sacrificial substrate;
fabricating a second half core and surrounding features by electroplating;
extending the via posts past the second half core;
laminating a layer of dielectric over the second half core, surrounding features and via posts, and
thinning the dielectric layers on both sides to expose the ends of via posts.

17. The process of claim 16 comprising the steps of:
(a) obtaining a sacrificial substrate;
(c) applying a first seed layer;
(d) applying a first layer of photoresist;
(e) exposing and developing a pattern including a first half core and surrounding features;
(g) electroplating a first half core and surrounding features into the first pattern;
(h) applying a second layer of photoresist over the first layer;
(i) exposing and developing a pattern of via posts;
(j) pattern plating a metal layer to fabricate via posts;
(k) stripping away the first and second layers of photoresist;
(m) laminating a first dielectric layer over the exposed first half core and surrounding via posts;
(n) etching away the sacrificial substrate;
(q) applying a third layer of photoresist;
(r) exposing and developing a pattern including a second half core and surrounding features;
(s) plating the second half core and surrounding features into the pattern;
(t) applying a fourth layer of photoresist over the second half core and surrounding features;
(u) exposing and developing a pattern of via posts;
(v) plating a fourth layer of via posts into the pattern in the fourth layer of photoresist;
(w) stripping away the third and fourth layers of photoresist thereby exposing the second half core, surrounding features and via posts;
(x) etching away the seed layer;
(y) laminating a second layer of dielectric over the second half core, features and surrounding via posts, and
(z) thinning the dielectric layers to expose ends of via posts.

18. The process of claim 17 further comprises the following steps:
(b) panel plating a barrier layer, and
(o) removing the barrier layer.

19. The process of claim 17 further comprises the following steps:
(l) removing the first seed layer, and
(p) applying a second seed layer.

20. The process of claim 17 wherein step (x) further comprising step (x2) of etching away the barrier layer and the first seed layer.

21. The process of claim 17 further comprises:
step (f) pattern plating a barrier layer and
step (p) depositing a second seed layer over newly exposed surface.

22. The process of claim 17 further comprising building up additional layers on at least one side.

23. The process of claim 17 wherein the planar metal core is totally encapsulated.

* * * * *